US012622207B2

(12) United States Patent　　　　(10) Patent No.: US 12,622,207 B2

Uzoh et al.　　　　　　　　　　　(45) Date of Patent:　　May 5, 2026

(54) APPARATUS FOR SEPARATING SINGULATED DIE FROM SUBSTRATE DICING TAPE AND METHODS OF USING THE SAME

(71) Applicant: Adeia Semiconductor Bonding Technologies Inc., San Jose, CA (US)

(72) Inventors: Cyprian Emeka Uzoh, San Jose, CA (US); Thomas Workman, San Jose, CA (US); Gabriel Z. Guevara, Gilroy, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 136 days.

(21) Appl. No.: 18/239,394

(22) Filed: Aug. 29, 2023

(65) Prior Publication Data

US 2025/0006520 A1　　Jan. 2, 2025

Related U.S. Application Data

(60) Provisional application No. 63/524,348, filed on Jun. 30, 2023.

(51) Int. Cl.
　*B32B 43/00*　　　(2006.01)
　*H01L 21/67*　　　(2006.01)
　*H01L 21/683*　　(2006.01)

(52) U.S. Cl.
　CPC .... *H01L 21/67132* (2013.01); *H01L 21/6838* (2013.01); *B32B 43/006* (2013.01); *H01L 21/6836* (2013.01); *H01L 2221/68327*

(2013.01); *H01L 2221/68381* (2013.01); *Y10T 156/1132* (2015.01); *Y10T 156/1179* (2015.01);

(Continued)

(58) Field of Classification Search
　CPC ............ B32B 43/006; Y10T 156/1132; Y10T 156/1179; Y10T 156/1944; Y10T 156/1983

See application file for complete search history.

(56) References Cited

U.S. PATENT DOCUMENTS 6,165,310　A　*　12/2000　Freund ................ H01L 21/6838
　　　　　　　　　　　　　　　　　　156/707
6,290,805　B1 *　9/2001　Freund ................ H01L 21/6838
　　　　　　　　　　　　　　　　　　156/707

(Continued)

*Primary Examiner* — Philip C Tucker
*Assistant Examiner* — Nickolas R Harm
(74) *Attorney, Agent, or Firm* — HG LAW LLP

(57)　　　　　ABSTRACT

Embodiments herein are generally directed to ejection assemblies for singulated dies and thinned wafers and methods related thereto. Die ejection assemblies may be used to minimize cracking or deformation of dies during post-singulation processing. Thus, the die ejection assemblies and methods described herein reduce the number of dies rejected after singulation and the number of failures during a die bonding process. In one general aspect, an apparatus for removing singulated dies from a dicing tape is provided. The apparatus may include a die ejector assembly, which may include a vacuum plate configured to engage with a portion of the dicing tape. A die ejector may be disposed in an ejector opening of the vacuum plate. One or more actuators may be configured to move at least a portion of the die ejector in a lateral direction relative to the upper surface of the vacuum plate.

18 Claims, 6 Drawing Sheets

(52) U.S. Cl.
CPC .... *Y10T 156/1944* (2015.01); *Y10T 156/1983*
(2015.01)

(56)     References Cited

U.S. PATENT DOCUMENTS

| | | | | |
|---|---|---|---|---|
| 6,629,553 | B2 * | 10/2003 | Odashima ........... | H01L 21/6836 |
| | | | | 438/464 |
| 7,240,422 | B2 * | 7/2007 | Cheung ............... | H01L 21/6838 |
| | | | | 29/721 |
| 8,137,050 | B2 * | 3/2012 | Yamada ............ | H01L 21/67144 |
| | | | | 414/416.05 |
| 9,987,838 | B2 * | 6/2018 | Uemura ............... | B23K 26/402 |
| 2002/0072202 | A1 * | 6/2002 | Odashima ......... | H01L 21/67144 |
| | | | | 438/460 |
| 2005/0255673 | A1 * | 11/2005 | Cheung .............. | H01L 21/6838 |
| | | | | 438/464 |
| 2007/0069340 | A1 * | 3/2007 | Yamada ................. | H01L 24/95 |
| | | | | 257/664 |
| 2009/0242124 | A1 * | 10/2009 | Konno ............. | H01L 21/67011 |
| | | | | 156/716 |
| 2019/0067053 | A1 * | 2/2019 | Minnich ............ | H01L 21/6836 |

* cited by examiner

520

526 528

620

720

APPARATUS FOR SEPARATING SINGULATED DIE FROM SUBSTRATE DICING TAPE AND METHODS OF USING THE SAME

CROSS-REFERENCE TO RELATED APPLICATIONS

This application claims benefit of U.S. Provisional Application No. 63/524,348, filed Jun. 30, 2023, which is incorporated by reference herein.

FIELD

The present disclosure relates to integrated circuit (IC) packaging, and in particular, to systems and methods for removing a die or thinned wafer from dicing tape.

BACKGROUND

Integrated circuit (IC) packaging processes may include an operation for dicing a wafer to form singulated dies. The wafer is typically thinned prior to singulation using a combination of backgrind, polishing and etch processes. The wafer may be mounted on a dicing tape before or after thinning operations. The dicing tape secures the wafer and the individual dies during dicing operations. The dicing process may comprise reactive ion etching (RIE), dry etch, wet etch, saw dicing, laser dicing, or combinations thereof. The cleaned singulated dies are then separated from the dicing tape and prepared for packaging in subsequent operations.

Unfortunately, as wafer thickness requirements decrease, conventional methods of separating singulated dies from the dicing tape have resulted in increasing defectivity, such as marks or scratches, internal or external cracks, or deformation in the separated die. Typically, the increased defectivity is related to induced pressure points on the dies during the separation process. For example, in some separation processes, ejector pins may be used to push upwardly on the dicing tape to help separate the singulated die therefrom. The pins may have a sharp head that may puncture the dicing tape and contact the die, cracking or plastically deforming the die. The cracked or deformed die may be rejected after separation or may fail during subsequent packaging operations, such as bonding operations, contaminating the bonding surface of the host substrate and ultimately resulting in reduced yield and increased manufacturing costs. Further, if the die shatters during separation, fragments of the shattered die may contaminate surrounding dies, further reducing the yield.

Thin dies, such as dies having a thickness of 30 microns or less, are more susceptible to damage during removal because of the stress induced by the small contact area of the pins. Apart from their thickness, thinner dies are more fragile than thicker dies on account of their thermal processing history and the combination of integrating materials having different mechanical properties, such as Young's modulus and coefficient of thermal expansion (CTE). For example, for a silicon device having a copper back end of line (BEOL) with silicon oxide dielectric layers, the CTE of silicon oxide dielectric may be about 0.5 ppm/° C., the CTE of the silicon substrate may be about 2.5 ppm/° C., and the CTE of the integrated copper conductive layer may be about 17 ppm/° C. In practice, the formed host substrate comprises an asymmetric thin laminate, which thins the host substrate from its backside and tends to increase the warpage of the thinned substrate or the singulated substrate. Increasing the warpage may result in higher non-uniform stresses in the thinned substrate or thinned singulated dies. Thus, the thinned substrates or dies require a gentler ejection method.

Accordingly, there is a need in the art for an improved apparatus for separating singulated dies from a substrate dicing tape, and methods related thereto.

SUMMARY

Aspects of the present disclosure are generally directed to apparatus for separating singulated dies from a substrate dicing tape and methods related thereto. The apparatus may be used advantageously to minimize cracking or deformation of dies during post-singulation processing. Thus, the die ejection assemblies and methods described herein reduce the number of dies rejected after singulation and the number of failures during subsequent die packaging operations, such as die to die or die to wafer bonding process.

In one general aspect, an apparatus for separating singulated dies from a substrate dicing tape is provided. The apparatus may include a die ejector assembly. The die ejector assembly may include a movable vacuum plate configured to engage with a portion of the substrate dicing tape. The vacuum plate may have an ejector opening disposed therethrough. The die ejector assembly may further include a die ejector disposed in the ejector opening. The die ejector assembly may further include one or more actuators configured to move at least a portion of the die ejector in a lateral direction relative to the upper surface of the vacuum plate.

Implementation of the general aspect may include one or more of the following features. The die ejector assembly may include a flexible barrier disposed over the ejector opening, where the die ejector is disposed below the flexible barrier. The die ejector may have a length that is at least 2× greater than its width, and the length is parallel to the upper surface of the vacuum plate and orthogonal to the lateral direction. The die ejector may include a cylinder, roller, or resilient member. The one or more actuators may be configured to position at least a portion of the die ejector above the upper surface of the vacuum plate concurrently with moving the die ejector in the lateral direction.

In another general aspect, a method for removing a singulated die from a substrate dicing tape is provided. The method may include aligning a die ejector assembly with a portion of the substrate dicing tape having the singulated die disposed thereon. The die ejector assembly may include any one or combination of the features described above. The method may include engaging the vacuum plate with the substrate dicing tape by exerting a vacuum therebetween. The method may further include exerting, by use of the die ejector, a lateral force on the portion of the substrate dicing tape having the singulated die disposed thereon.

Implementation of the general aspect may include one or more of the following. The method may include moving the die ejector from a position proximate to a first edge of the singulated die to a position proximate to an opposite second edge of the singulated die. The method may include concurrently with exerting the lateral force on the portion of the substrate dicing tape, engaging the singulated die using an end effector disposed thereabove.

In another general aspect, an apparatus for removing singulated dies from a substrate dicing tape is provided. The apparatus may include a die ejector assembly. The die ejector assembly may include a vacuum plate having an ejector opening disposed therethrough. The die ejector assembly may include a die ejector disposed in the ejector opening. The die ejector may include a resilient member and a plurality of pins disposed below the resilient member. The die ejector assembly may include one or more actuators coupled to the die ejector, where the one or more actuators may be configured to engage the plurality of pins with the resilient member.

Implementation of the general aspect may include one or more of the following features. The die ejector, where at least a portion of the resilient member is disposed above an upper surface of the vacuum plate when the plurality of pins are engaged therewith. The resilient member may include a spring. The resilient member may be coupled to the vacuum plate.

In another general aspect, a method for removing a singulated die from a substrate dicing tape is provided. The method may include aligning a die ejector assembly with a portion of the substrate dicing tape having the singulated die disposed thereon. The die ejector assembly may include any one or combination of the features described above. The method may include engaging the vacuum plate with the substrate dicing tape by exerting a vacuum therebetween. The method may include exerting, by use of the die ejector, an upward force on the portion of the substrate dicing tape.

Implementation of the general aspect may include one or more of the following features. The method may include sequentially engaging the plurality of pins with the resilient member disposed thereover. In some embodiments, the plurality of pins are sequentially engaged from a first pin positioned proximate to a first edge of the singulated die to an $n^{th}$ pin positioned proximate to a second opposite edge of the singulated die. The method may include concurrently with exerting the upward force on the portion of the substrate dicing tape, engaging the singulated die using an end effector disposed thereabove.

In another general aspect, an apparatus for transferring a thinned wafer from a backgrind tape is provided. The apparatus may include a wafer ejector assembly. The wafer ejector assembly may include a vacuum plate having an ejector opening disposed therethrough. The wafer assembly may include a wafer ejector disposed in the ejector opening.

Implementation of the general aspect may include one or more of the following features. The method may include aligning the wafer ejector assembly with a portion of the backgrind tape having the thinned wafer disposed thereon. The method include engaging the vacuum plate with the backgrind tape by exerting a vacuum therebetween. The method may include exerting, by use of the wafer ejector, a lateral force on the portion of the backgrind tape having the thinned wafer disposed thereon. In some embodiments, the method may include bonding a bonding surface of the thinned wafer to a bonding surface of a host substrate.

Figure 1:
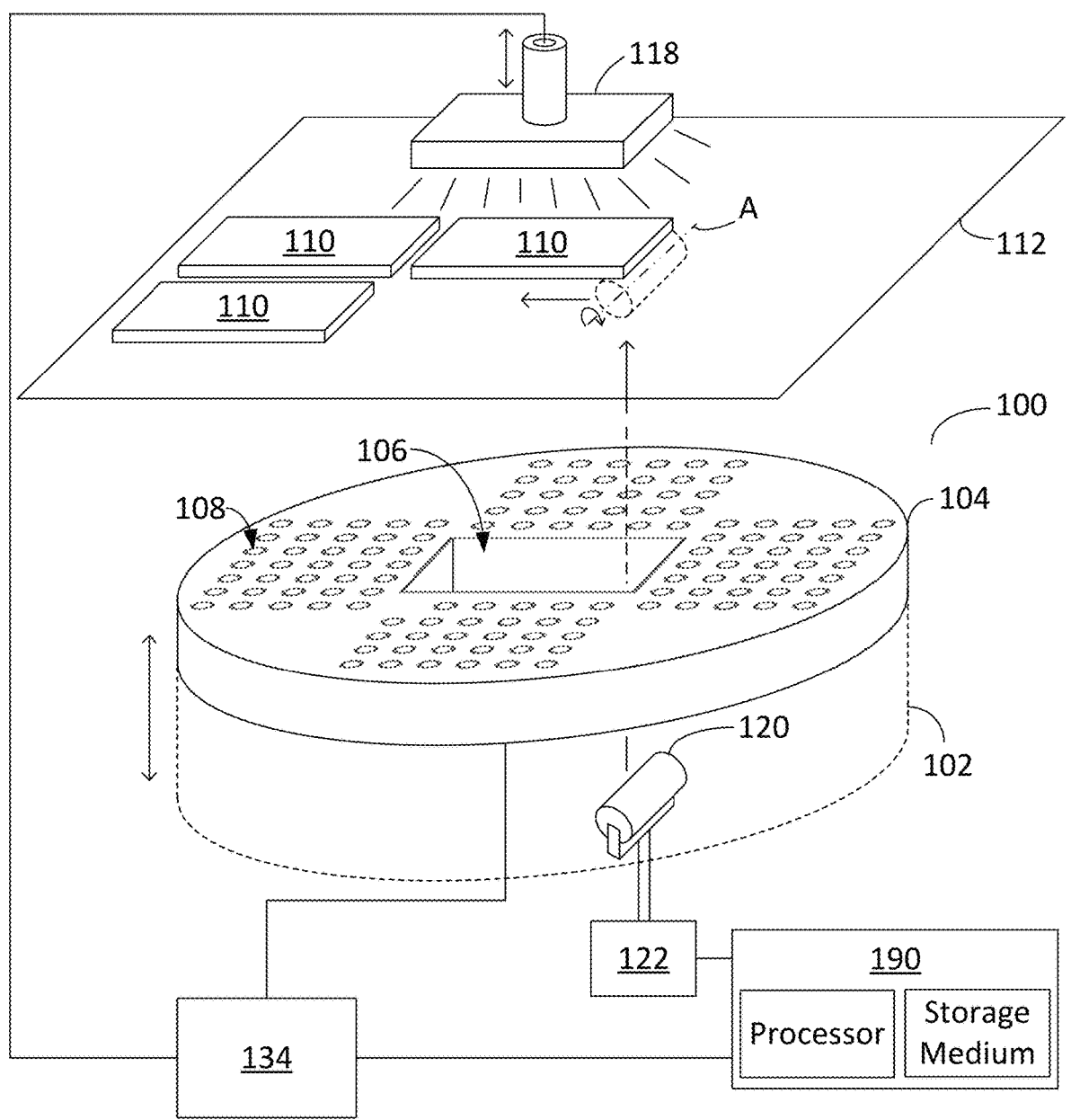
FIG. 1 is a schematic illustration of an apparatus for separating singulated dies from a dicing tape in accordance with embodiments of the present disclosure.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, article, or portion thereof that provides a base material or supporting surface used to manufacture singulated electronic devices. For example, a substrate may include "semiconductor substrates" that provide a supporting material upon which elements of a semiconductor device are fabricated or attached, and any material layers, features, and/or electronic devices formed thereon, therein, or therethrough. The term "wafer" generally refers to a semiconductor substrate used to manufacture a plurality of electronic devices, such as integrated circuits microelectromechanical systems (MEMS), sensors, and/or components thereof. The terms "singulated devices" or "singulated die" refer to one or more devices or device components that have been divided from a wafer, e.g., by use of a dicing operation. Thus, it should be noted the term "singulated" is not intended to be limited to a single device or die, as in some embodiments, the singulated device may include a plurality of stacked devices that have been divided from two or more bonded substrates, such as a stack of bonded memory devices. In some embodiments, a singulated device or singulated die may include two or more adjacent devices formed on the same substrate and divided therefrom.

The singulated dies herein generally have an active side comprising semiconductor device elements, such as transistors, resistors, and capacitors, and a "backside" that is opposite the device side. The term "active side" should be understood to include a surface of the die and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "backside" (opposite the active side) includes the non-active side of the substrate at any stage of device fabrication, including the surfaces of any material layer, any feature formed thereon or extending outwardly therefrom, and/or any openings formed therein. Thus, the terms "active side" or "backside" may include the respective surfaces of a semiconductor substrate at the beginning of device fabrication and any surfaces formed during material removal, e.g., after substrate thinning operations. Depending on the stage of device fabrication or assembly, the terms "active" and "backside" are also used to describe surfaces of material layers, temporary coatings, or features formed on, in, or through the semiconductor substrate, whether or not the material layers or features are ultimately present in the fabricated or assembled device. In some embodiments, the backside of the singulated dies may comprise passive elements, such as capacitors, resistors, inductors, optical elements, and electrical circuits, to name a few examples.

Spatially relative terms are used herein to describe the relationships between elements, such as the relationships between apparatus, substrates, and devices. Unless the relationship is otherwise defined, terms such as "above," "over," "upper," "upwardly," "outwardly," "on," "below," "under," "beneath," "lower," "vertical," "horizontal," "lateral," and the like are generally made with reference to the X, Y, and Z directions in the drawings. Thus, it should be understood that the spatially relative terms used herein are intended to encompass different orientations of the apparatus, substrates, dies, or devices and, unless otherwise noted, are not limited by the direction of gravity.

FIG. 1 is a schematic illustration of an apparatus for separating a singulated die 110 from a dicing tape 112 in accordance with embodiments of the present disclosure. As shown, the apparatus includes a die ejector assembly 100, an end effector 118 (e.g., a pickup head), and a controller 190.

The die ejector assembly 100 generally includes a housing 102, a die ejector 120 disposed in the housing 102, and one or more actuators (e.g., actuator 122) coupled to the die ejector 120, where the one or more actuators are configured to move the die ejector 120 vertically and laterally with respect to the housing 102. The housing 102 includes a vacuum plate 104 having a plurality of vacuum openings 108 and an ejector opening 106 disposed therethrough. During operation, the die ejector assembly 100 is movable with respect to the dicing tape 112 disposed thereover, e.g., to reposition the die ejector 120 below desired portions of the dicing tape 112. The vacuum plate 104 is fluidly coupled to a vacuum source 134 and is used to engage and secure the dicing tape 112 during the die separation process. For example, the housing 102 may be movable in the X, Y, and/or Z-directions in order to position and engage the upper surface of the vacuum plate 104 with a desired portion of the dicing tape 112 having a to-be-separated singulated die 110 disposed thereon. Here, the die ejector assembly 100 engages and secures the dicing tape 112 by exerting a vacuum between the vacuum plate 104 and the portion of the dicing tape 112 disposed thereover. As shown, the die ejector 120 is disposed in the ejector opening 106 and is movable with respect to the vacuum plate 104 and the portion of the dicing tape 112 secured thereto. The die ejector 120 is configured to exert a lateral force on a portion of the dicing tape 112 having a to-be-separated singulated die 110 disposed thereon. Typically, the end effector 118 is positioned above the singulated die 110 and is used to exert an upward force on the singulated die, e.g., by use of a vacuum, concurrently with the upward and lateral force exerted by the die ejector 120 against the dicing tape 112.

As shown, the ejector opening 106 is larger than each singulated die 110 such that each singulated die 110 fits within a boundary of the ejector opening 106. In other embodiments, the ejector opening 106 may be substantially the same size as the singulated dies, or may have a different size and/or shape so that only a portion of the singulated die fits within the boundary of the ejector opening 106. The ejector opening 106 is shown having a rectangular shape, similar to the singulated die 110, but in other embodiments the ejector opening 106 may have a shape of a circle, ellipse, oval, or any suitable polygon. In some embodiments, the ejector opening 106 is sized to ensure each singulated die 110 adjacent to the to-be-separated die are positioned above the vacuum plate 104 and not above the ejector opening 106.

In FIG. 1, the die ejector 120 comprises a roller having a substantially cylindrical shape and an axis of rotation A that is parallel to the upper surface of the vacuum plate 104 and orthogonal to the direction of lateral movement. For example, here the actuators 122 move the die ejector 120 in a vertical direction through the ejector opening 106 to exert an upward force on the dicing tape 112 before moving the die ejector 120 laterally. Typically, the dicing tape 112 is formed of an elastic material and the combination of upward force and lateral movement of the die ejector against the dicing tape deforms, e.g., stretches, the portion of the dicing tape 112 disposed over the ejector opening. The singulated die is typically formed of a rigid plate for thick dies (e.g., having a thickness greater than 200 microns), or an elastically flexible plate or asymmetric composite pliable plate for thinner dies. The rigid plate may be a plate that does not stretch or deform an appreciable amount in the lateral direction. In some embodiments, the singulated die may be formed from a silicon wafer. Whilst engaged, the axis of rotation of the roller (e.g., the center axis of the cylinder) is substantially parallel to the upper surface of the vacuum plate 104. For example, the axis of rotation may be within 5 degrees of the upper surface, such as within 2 degrees of the upper surface, such as within 1 degree of the upper surface, such as within 0.5 degrees of the upper surface. The actuators 122 further move the die ejector 120 in a lateral direction relative to the upper surface of the vacuum plate 104 as the end effector 118 engages and gently removes or peels the singulated die 110 disposed between the die ejector 120 and the end effector 118 from the dicing tape 112. The end effector 118 connects to the vacuum source 134 and engages the singulated die 110 by exerting a vacuum therebetween.

A controller 190 controls the die ejector assembly 100. The controller 190 comprises a processor and a non-transitory computer-readable storage medium comprising computer-executable instructions. The controller 190 connects to the actuators 122 and to the vacuum source 134. The processor may execute the computer-executable instructions to control the vertical and lateral movement of the die ejector 120 and to control the vacuums exerted between the vacuum plate 104 and the dicing tape 112 and between the end effector 118 and the dicing tape 112.

In some embodiments, the cylinder of the die ejector 120 does not rotate about its center axis. When the die ejector 120 moves in the lateral direction, the outer surface of the cylinder drags across the lower surface of the dicing tape 112. In some embodiments, the die ejector 120 comprises a member having a non-cylindrical shape. The member may be defined by any number of sides that form any desired shape, such as polygonal shapes, including non-rectangular quadrilateral shapes, curved shapes including circular, elliptical, convex or concave arc shapes, irregular shapes, or combinations thereof. For example, the member may be a prism and a face or edge of the prism may be parallel to the upper surface of the vacuum plate 104 and engage the lower side of the dicing tape 112. In some embodiments, the die ejector 120 comprises a coil spring or a cylindrically-shaped spring and the actuators 122 may move the spring orthogonal to its centerline. In some embodiments, the die ejector 120 has a length greater than its width. In some embodiments, the die ejector 120 has a length that is at least 2× (or twice) greater than its width. In some embodiments, the die ejector 120 has a length that is at least 3× (or three times)

greater than its width, such as at least 4× (or four times) greater than its width, such as at least 5× (or five times) greater than its width. The length of the die ejector 120 is parallel to the upper surface of the vacuum plate 104 and orthogonal to the lateral direction.

In some embodiments, the ejector opening 106 is centrally located in the vacuum plate 104. For example, the vacuum openings 108 may surround each side of the ejector opening 106. The ejector opening 106 may encompass the centroid of the vacuum plate 104. In some embodiments, the ejector opening 106 may be at least partially disposed within a radius that is half the radius of the vacuum plate, such as within a radius that is a third of the radius of the vacuum plate, such as within a radius that is a fourth of the radius of the vacuum plate, to name a few examples.

Figure 2:
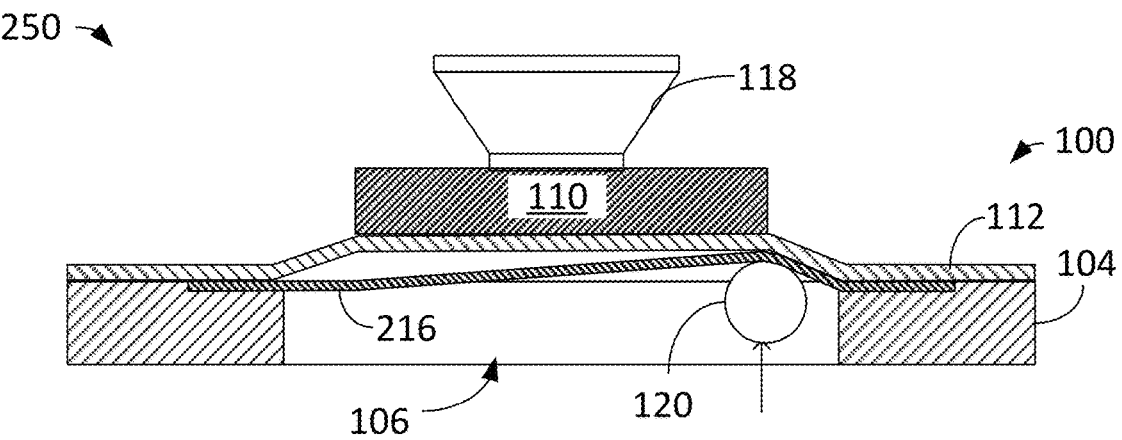
FIG. 2 shows side sectional views of a portion of the die ejector assembly from FIG. 1 at different points in the separation process, in accordance with embodiments of the present disclosure.
Figure 2:
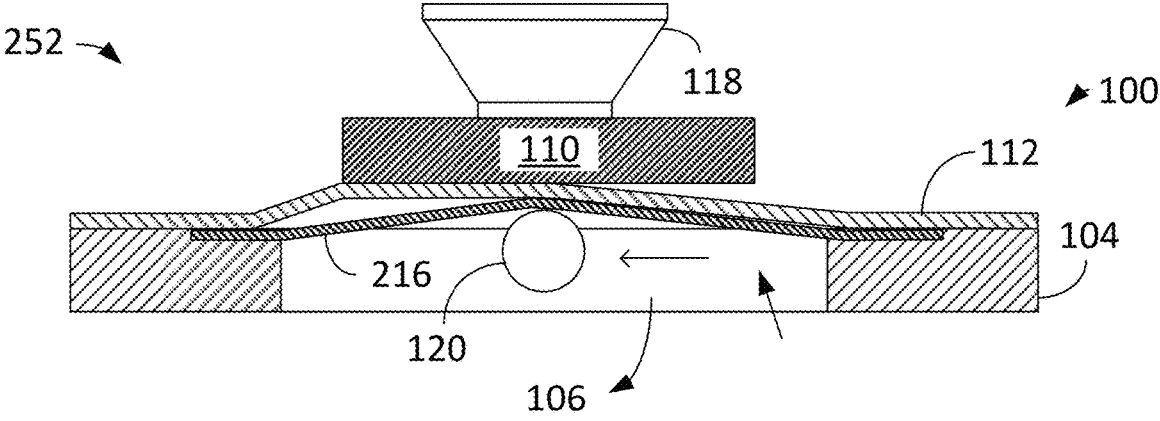
Figure 2:
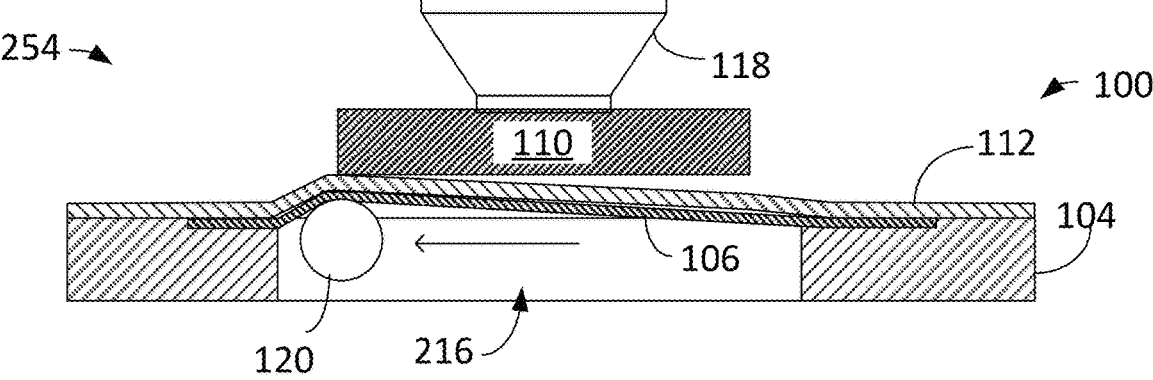

FIG. 2 shows side sectional views of a portion of the die ejector assembly 100 at different points in time (e.g., a beginning point 250, mid-point 252, and endpoint 254), in accordance with embodiments of the present disclosure. In particular, FIG. 2 shows the die ejector 120 exerting the lateral force on a portion of the dicing tape 112 by moving the die ejector 120 from a position proximate to a first edge of the singulated die 110 (e.g., at the beginning point 250 in time) to a position proximate to an opposite second edge of the singulated die 110 (e.g., at the endpoint 254 in time). For example, the die ejector 120 may be positioned such that it contacts the dicing tape 112, and at least of portion of the die ejector 120 is positioned below the first and second edges of the singulated die 110 at the beginning point 250 in time and endpoint 254 in time, respectively.

The die ejector assembly 100 may further include a flexible barrier 216 not shown in FIG. 1. The flexible barrier 216 is disposed over the ejector opening 106 and between the vacuum plate 104 and the dicing tape 112. The die ejector 120 is disposed below the flexible barrier 216 and contacts the flexible barrier 216 when exerting the upward and lateral forces on the dicing tape 112. The flexible barrier 216 ensures the die ejector 120 does not contact the dicing tape 112, which may reduce or eliminate residue from the dicing tape 112 on the die ejector 120. The flexible barrier 216 may be removed to allow for cleaning or replacement. The flexible barrier 216 may comprise a flexible material, such as a mesh, polymer, polymeric membrane, or a thin bladder, to name a few examples. In some embodiments, the flexible material may be any material that can bend or compress without cracking when the die ejector 120 exerts the upward and lateral forces on the dicing tape 112. The flexible barrier 216 may serve as a sacrificial barrier between the die ejector 120 and the dicing tape 112 to prevent puncture of the dicing tape 112, for example, if pins are used to eject the singulated die 110.

At the beginning point 250 in time, the processor of the controller 190 (FIG. 1) may execute the computer-executable instructions to have the actuators 122 align the die ejector assembly 100 with the portion of the dicing tape 112 having the singulated die 110 disposed thereon. For example, the die ejector 120 may be positioned below the first edge of the singulated die 110. The processor may execute the computer-executable instructions to engage the vacuum plate 104 with the dicing tape 112 by exerting a vacuum therebetween. The actuators 122 move the die ejector 120 vertically through the ejector opening 106 until the die ejector 120 pushes the flexible barrier 216 and the dicing tape 112 towards the singulated die 110 and at least a portion of the die ejector 120 (referred to as portion of the die ejector 120) is positioned above the upper surface of the vacuum plate 104. The end effector 118, shown as a vacuum nozzle, is positioned above the singulated die 110.

At the mid-point 252 in time, the processor may execute the computer-executable instructions to have the actuators 122 move the die ejector 120 to exert a lateral force on the portion of the dicing tape 112 having the singulated die 110 disposed thereon. For example, the die ejector 120 is moved in the lateral direction relative to the upper surface of the vacuum plate 104, while the die ejector 120 is engaged with the dicing tape 112, such that the roller maintains contact with the dicing tape 112 and rotates about its axis of rotation. The portion of the die ejector 120 remains above the upper surface of the vacuum plate 104 while the die ejector 120 moves in the lateral direction. Portions of the flexible barrier 216 and the dicing tape 112 move upward in a wave-like manner as the die ejector 120 moves in the lateral direction, and in turn move the singulated die 110 upward towards the end effector 118. The end effector 118 engages with the singulated die 110 by exerting a vacuum therebetween, peeling the singulated die 110 off the dicing tape 112 as the die ejector 120 continues to exert the lateral force by moving in the lateral direction.

At the endpoint 254 in time, the die ejector 120 has finished its lateral movement. The portion of the die ejector 120 remains above the upper surface of the vacuum plate 104 and the die ejector 120 is positioned below the second edge of the singulated die 110. The singulated die 110 may be peeled off the dicing tape 112 either by lowering the die ejector 120 such that the portion of the die ejector 120 is below the upper surface of the vacuum plate 104, raising the end effector 118 while exerting the vacuum, or both. In some embodiments, the singulated die 110 may be peeled off the dicing tape 112 at endpoint 254. In some embodiments, the singulated die 110 may be peeled off the dicing tape 112 before endpoint 254, such as at or before mid-point 252.

In some embodiments, depending on the adhesion of the backside of the singulated die 110 to the dicing tape 112, the singulated die 110 may be detached from the dicing tape 112 during the lateral motion of the die ejector 120 between the beginning point 250 and the mid-point 252. In some embodiments, the die ejector assembly 100 may comprise of multiple die ejectors 120. In such embodiments, one of the die ejectors 120 may move vertically while another die ejector 120 moves laterally, which may assist peeling off the singulated die 110 from the dicing tape 112. The vertical motion of at least a portion of the die ejectors 120 may be configured to sequentially move up and down during the peeling operation of the singulated die 110 from the dicing tape 112.

In some embodiments, the die ejector assembly 100 may be used to directly transfer the singulated die 110 to a to-be-bonded substrate. For example, the die ejector 120 may eject the singulated die 110 on the to-be-bonded substrate without using the end effector 118.

In some embodiments, the flexible barrier 216 is coupled to the vacuum plate 104 by fasteners, an adhesive, or another temporary bonding mechanism. In some embodiments, the vacuum plate 104 engages with flexible barrier 216 by exerting a vacuum therebetween. In some embodiments, the flexible barrier 216 spans the entire surface of the vacuum plate 104. In some embodiments, the flexible barrier 216 is coupled to sides of the vacuum plate 104. In some embodiments, the flexible barrier 216 is disposed under the ejector opening 106 and may be coupled to the underside of the vacuum plate 104.

In some embodiments, the flexible barrier 216 moves with the dicing tape 112. For example, the upper surface of the flexible barrier 216 may remain in contact with the lower surface of the dicing tape 112 at the beginning point 250, mid-point 252, and endpoint 254 in time. In some embodiments, the flexible barrier 216 moves independently of the dicing tape 112. For example, a space may exist between a portion of the flexible barrier 216 and the dicing tape 112. In some embodiments, the flexible barrier 216 may comprise a bladder that may be inflated momentarily to assist the peeling of the singulated die 110 from the dicing tape 112.

Figure 3:
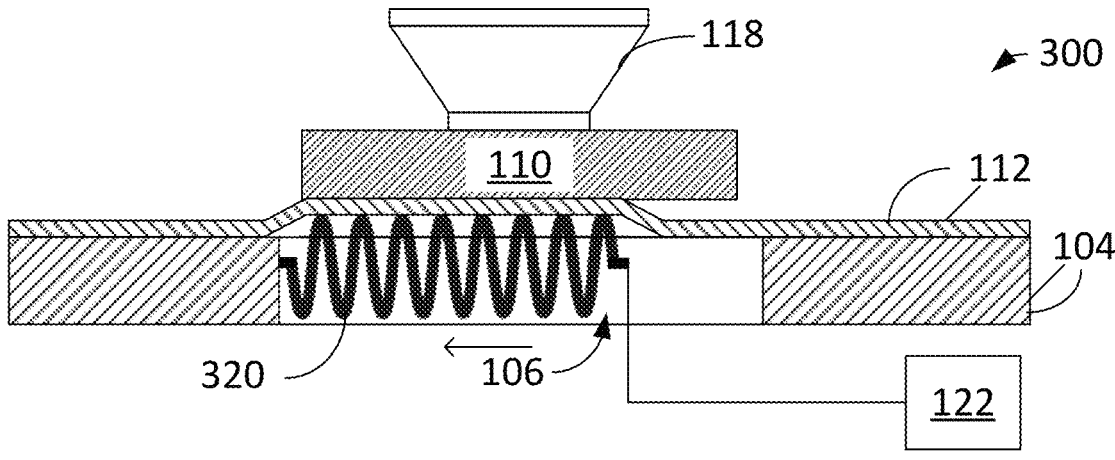
FIG. 3 is a schematic sectional view of a portion of a die ejector assembly in accordance with embodiments of the present disclosure.

FIG. 3 is a schematic sectional view of a portion of a die ejector assembly 300 in accordance with embodiments of the present disclosure. The die ejector assembly 300 includes the vacuum plate 104 having the ejector opening 106 and a die ejector 320. The die ejector 320 includes a resilient member, which is a structure or device that under normal operating conditions, undergoes elastic deformation. For example, the resilient member may deform under a compressive or tensile force and return to its initial shape when the force is released. The resilient member may be a compliant mechanism that includes a flexible mechanism to transmit force and motion through elastic body deformation. In the embodiment depicted in FIG. 3, the resilient member comprises a cylindrically-shaped spring.

A first end of the cylindrically-shaped spring is coupled to the vacuum plate 104, such as to a sidewall of the ejector opening 106. The actuators 122 push a second opposite end towards the first end to compress the cylindrically-shaped spring and move a portion of the cylindrically-shaped spring (e.g., the second end) in the lateral direction. The actuators may push the second end towards the first end along the center axis of the cylindrically-shaped spring. As the spring compresses, its outer diameter expands and an outer portion of the spring is positioned above the upper surface of the vacuum plate 104, exerting an upward force on the dicing tape 112. As the spring is further compressed, the outer portion exerts the lateral force on the dicing tape 112. The end effector 118 engages and removes the singulated die 110 from the dicing tape 112 as the actuators 122 compress the cylindrically-shaped spring.

In some embodiments, the cylindrically-shaped spring may be a coil spring. In some embodiments, the cylindrically-shaped spring may be a conical, tapered, barrel, or a constant or variable-pitch spring. The conical, tapered, or barrel springs may provide a raised portion having a smaller area of contact than the coil spring. The smaller contact area exerts the lateral force on a smaller area of the dicing tape 112, which may facilitate peeling the singulated die 110 off the dicing tape 112. In some embodiments, the die ejector 320 may be momentarily moved vertically by the actuator 122 to exert an upward force on the dicing tape 112, which may assist in peeling the singulated die 110 from the dicing tape 112. In some embodiments, the die ejector 320 may comprise multiple cylindrically-shaped springs incorporated within the ejector opening 106. In such embodiments, one of the die ejectors 320 may move vertically to assist a laterally moving die ejector 320 in the peeling off the singulated die 110 from the dicing tape 112. The vertical motion of at least a portion of the die ejectors 320 may be configured to sequentially move up and down during the peeling operation of the singulated die 110 from the dicing tape 112.

Figure 4:
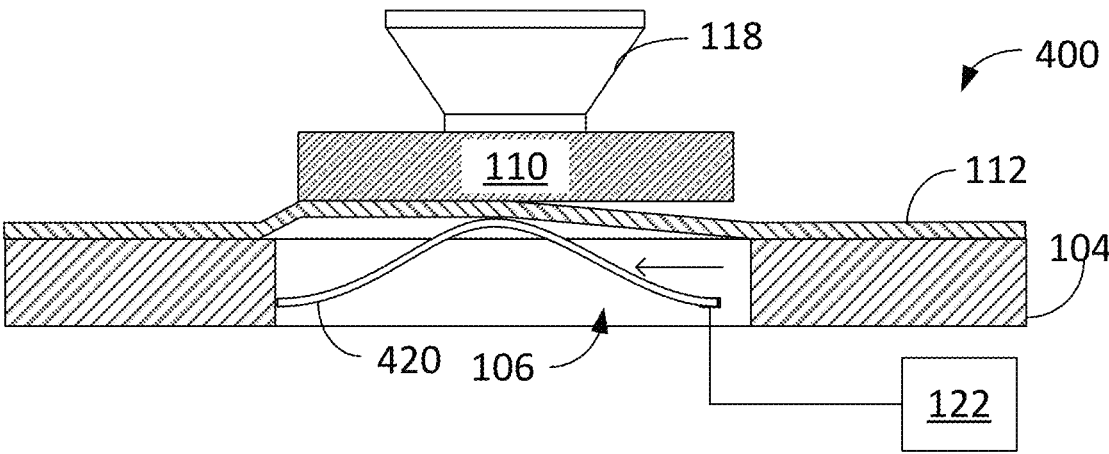
FIG. 4 is a schematic sectional view of a portion of a die ejector assembly in accordance with embodiments of the present disclosure.

FIG. 4 is a schematic sectional view of a portion of a die ejector assembly 400 in accordance with embodiments of the present disclosure. The die ejector assembly 400 includes the vacuum plate 104, which has the ejector opening 106, and a die ejector 420. The die ejector 420 includes a resilient member, which is depicted as a leaf spring. A first end of the leaf spring is coupled to the ejector opening 106.

The actuators 122 push an opposite second end towards the first end. As the leaf spring is compressed, a portion of the leaf spring moves vertically above the upper surface of the vacuum plate 104 and exerts an upward force on the dicing tape 112. As the leaf spring is further compressed, the portion of the leaf spring moves in the lateral direction, exerting the lateral force on the dicing tape 112. The end effector 118 engages the singulated die 110 and peels it off the dicing tape 112 as the leaf spring moves in the lateral direction.

In some embodiments, multiple die ejectors 420 may be incorporated within the ejector opening 106. In such embodiments, the die ejectors 420 may move vertically and/or laterally, such as described in relation to the die ejectors 120 in FIG. 2 and the die ejectors 320 in FIG. 3.

Figure 5:
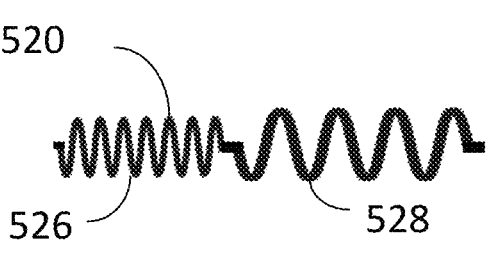
FIG. 5 schematic illustrates a die ejector in accordance with embodiments of the present disclosure.

FIG. 5 schematic illustrates a die ejector 520 in accordance with embodiments of the present disclosure. The die ejector 520 includes a first resilient member 526 and a second resilient member 528, which are cylindrically-shaped springs in the depicted embodiment.

The die ejector 520 may be used with either of the die ejector assembly 300 and die ejector assembly 400 discussed in relation to FIGS. 3 and 4, respectively. In such embodiments, the second resilient member 528 couples to the ejector opening 106 of the vacuum plate 104, and the first resilient member 526 couples to the second resilient member 528. The actuators 122 push the first resilient member 526 to compress both the first resilient member 526 and the second resilient member 528. The first resilient member 526 has a first spring constant and the second resilient member 528 has a second spring constant, which is greater than the first spring constant. For example, the second spring constant may at least 2× (or twice) greater than the first spring constant, such as at least 3× (or three times) greater, such as at least 4× (or four times) greater, such as at least 5× (or five times) greater.

The second resilient member 528 compresses and expands less than the first resilient member 526. The first resilient member 526 and the second resilient member 528 move laterally and expand vertically in a manner similar to the die ejector 320 to eject the singulated die 110. The second resilient member 528 provides a movable attachment point that allows the entire first resilient member 526 to move in the lateral direction when exerting the lateral force, which may facilitate the removal of the singulated die 110.

Figure 6:
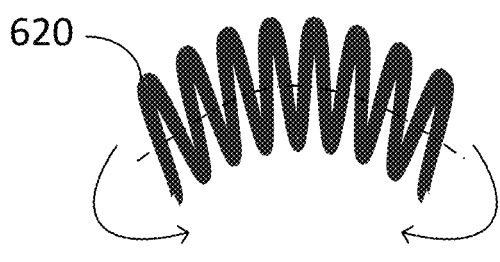
FIG. 6 schematic illustrates a die ejector in accordance with embodiments of the present disclosure.

FIG. 6 schematic illustrates a die ejector 620 in accordance with embodiments of the present disclosure. The die ejector 620 includes a resilient member, depicted as a coil spring, and may be used with the die ejector assembly 100 discussed in relation to FIGS. 1 and 2.

The actuators 122 exert a bending moment on the coil spring to position a portion of the coil spring above the upper surface of the vacuum plate 104. The actuators 122 move the coil spring in the lateral direction to exert a lateral force on the dicing tape 112. The lateral direction is orthogonal to the centerline of the coil spring such that, as depicted, the coil spring would move into and out of the page.

In some embodiments, the lateral direction is parallel to the centerline of the at-rest coil spring (e.g., the center line of the spring before the bending moment is exerted). In such embodiments, as depicted, the coil spring would move left and right on the page.

In some embodiments, the bending moment is not exerted and the coil spring is compressed before moving in the lateral direction. In some embodiments, the die ejector 620 includes a leaf spring that is compressed and moved in the lateral direction.

Figure 7:
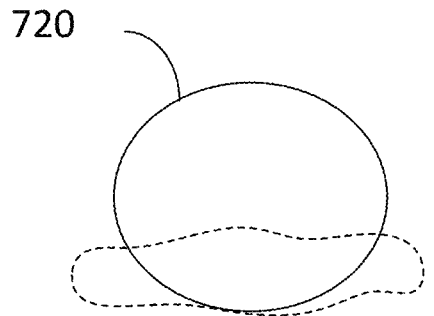
FIG. 7 schematic illustrates a die ejector in accordance with embodiments of the present disclosure.

FIG. 7 schematic illustrates a die ejector 720 in accordance with embodiments of the present disclosure. The die ejector 720 includes a bladder, such as a hollow bladder or an inflatable bladder, and may be used with the die ejector assembly 100 discussed in relation to FIGS. 1 and 2.

The bladder may be pneumatically inflated from a deflated configuration (shown as a dashed line), such as by an air compressor or compressed gas, to position a portion of the bladder above the upper surface of the vacuum plate 104. The actuators 122 may move the inflated bladder laterally to peel the singulated die 110 from the dicing tape 112 by exerting a lateral force on the dicing tape 112.

In some embodiments, the die ejector may be stationary or may only move vertically and the bladder may be inflated to assist in the peeling of the singulated die 110 from the dicing tape 112. In some embodiments, the bladder may be used with any of the die ejectors (the die ejectors 120, 320, 420, 520, 620) discussed in relation to FIGS. 1-6 to assist in peeling the singulated die 110 from the dicing tape 112. In some embodiments, the die ejector 120 may move vertically to move the bladder up and down during the peeling operation of the singulated die 110 from the dicing tape 112. In some embodiments, the die ejector 720 may comprise multiple bladders. The actuators 122 may sequentially move each bladder of the multiple bladders laterally during the peeling operation. The actuators 122 may move the bladders laterally at the same time. The actuators 122 may move a portion of the bladders laterally and a portion of the bladders vertically.

Figure 8:
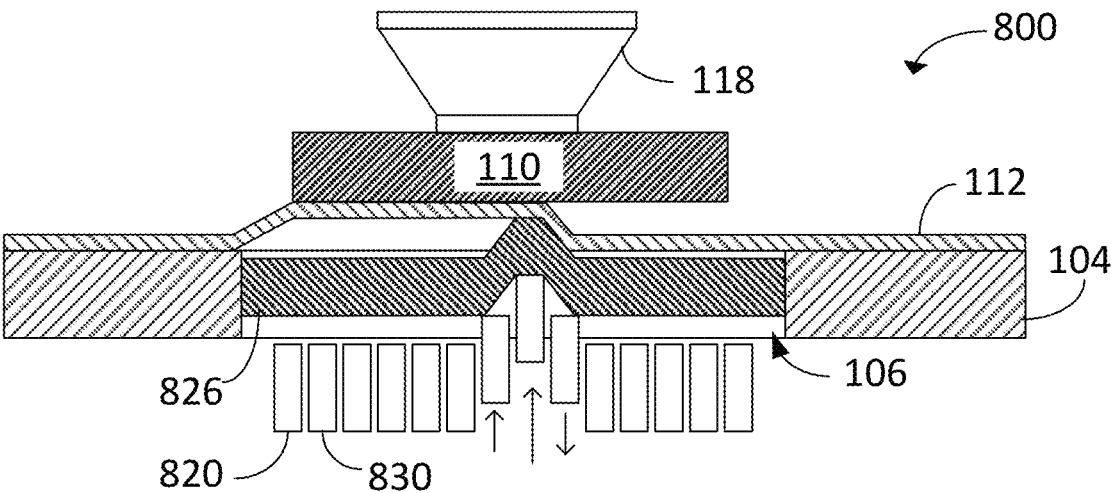
FIG. 8 is a schematic sectional view of a portion of a die ejector assembly in accordance with embodiments of the present disclosure.

FIG. 8 is a schematic sectional view of a portion of a die ejector assembly 800 in accordance with embodiments of the present disclosure. The die ejector assembly 800 includes the vacuum plate 104, which engages the dicing tape 112, and a die ejector 820. The die ejector 820 includes a resilient member 826, disposed in the ejector opening 106 of the vacuum plate 104, and a plurality of pins 830. The plurality of pins 830 push the resilient member 826 towards the singulated die 110 to exert an upward force on the dicing tape 112 and eject the singulated die 110.

The resilient member 826 is an elastically deformable member that transmits force and motion from the plurality of pins 830 to the singulated die 110 (FIG. 1) through elastic body deformation. In the embodiment depicted in FIG. 8, the resilient member 826 is a cylinder made of flexible material that spans the ejector opening 106. In some embodiments, the resilient member 826 may have the shape of a circle, ellipse, oval, or any suitable polygon. In some embodiments, the resilient member 826 may be similar to the resilient members previously discussed in relation to FIGS. 3-6.

The processor of the controller 190 (FIG. 1) may execute the computer-executable instructions to have the actuators 122 engage the pins 830 with the resilient member 826 to exert the upward force on the dicing tape 112. For example, the actuators 122 move the pins 830 vertically to push a portion of the resilient member 826 above the upper surface of the vacuum plate 104, which in turn pushes the dicing tape 112 towards the end effector 118. The actuators 122 may sequentially move the pins 830 from a first pin positioned proximate to the first edge of the singulated die 110 to an $n^{th}$ pin positioned proximate to a second opposite edge of the singulated die 110. The sequential engagement moves portions of the resilient member 826 upward and downward in a wave-like manner. The end effector 118 engages the singulated die 110 as the resilient member 826 moves the dicing tape 112 upward. The resilient member 826 is positioned below the upper surface of the movable vacuum plate 104 when not engaged by the pins 830.

In the embodiment depicted in FIG. 8, the resilient member 826 is coupled to the ejector opening 106. In some embodiments, the resilient member 826 does not couple to the vacuum plate 104 and may move with the die ejector 820. In some embodiments, the actuators 122 move the die ejector 820 in a vertical direction through the ejector opening 106 before moving the pins 830.

The die ejectors assemblies discussed in relation to FIGS. 1-8 may be used to remove thin dies from the dicing tape 112. The die ejectors apply the vertical force and/or lateral force over a larger area than conventional methods that use pins to remove the singulated die 110, which induces less stress in the singulated die 110. The thin dies may have a thickness of 50 microns or less, such as 25 microns or less, such as 20 microns or less, such as less than 10 microns, to name a few examples.

In some embodiments, the die ejection assemblies discussed in relation to FIGS. 1-8 may be used to directly transfer the singulated die 110 to a to-be-bonded substrate. For example, the singulated die 110 may be ejected on the to-be-bonded substrate without using the end effector 118. The direct transfer may reduce or eliminate the risk of surface contamination of the singulated die 110 because there is no contact with the end effector 118.

In some embodiments, the end effector 118 may place a side of the singulated die 110 that engages the dicing tape 112 (e.g., a lower side) on the to-be-bonded substrate for bonding. In some embodiments, the end effector 118 may be a flip tool that rotates the singulated die 110 away from the dicing tape 112 to bond an upper side of the singulated die 110 opposite the lower side to the to-be-bonded substrate.

Figure 9:
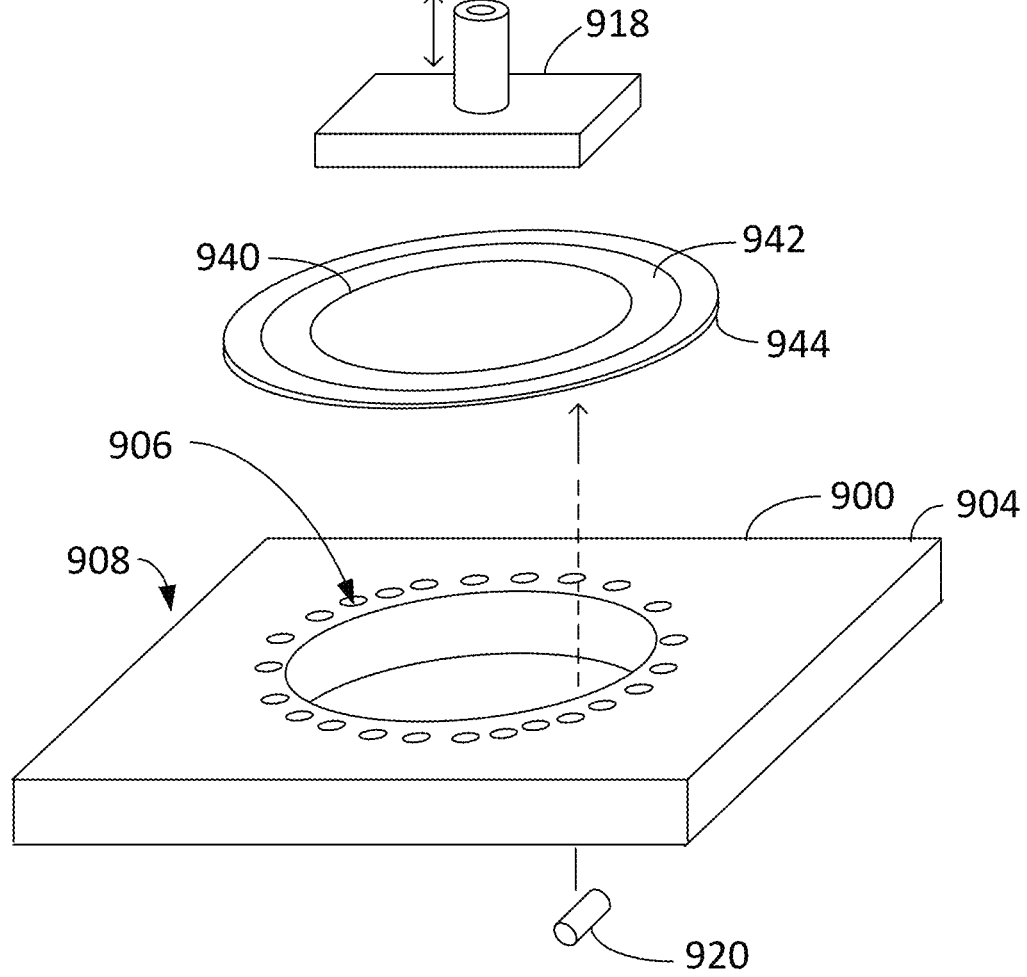
FIG. 9 is a schematic illustration of an apparatus for separating a wafer from a backgrind tape in accordance with embodiments of the present disclosure.

FIG. 9 is a schematic illustration of an apparatus for separating a thinned wafer 940 from a backgrind tape 942 in accordance with embodiments of the present disclosure. The backgrind tape 942 is coupled to the thinned wafer 940 and a backgrind tape frame 944 such that a gap is formed between the backgrind tape frame 944 and the thinned wafer 940.

The apparatus includes a wafer ejector assembly 900 and an end effector 918. The wafer ejector assembly 900 includes a vacuum plate 904 and a wafer ejector 920. The vacuum plate 904 has a plurality of vacuum openings 908 surrounding an ejector opening 906. The vacuum openings 908 are fluidly coupled to a vacuum source and engage the backgrind tape frame 944 to couple the thinned wafer 940 to the vacuum plate 904. The wafer ejector 920, which is shown as a cylinder, is disposed in the ejector opening 906. The wafer ejector 920 may exert a lateral force and/or a vertical force on a portion of the backgrind tape 942 to separate or eject the thinned wafer 940 from the backgrind tape 942. Actuators, such as the actuator 122 discussed in relation to FIG. 1, may move the wafer ejector 920. The end effector 918, which may function similar to the end effector 118 discussed in relation to FIG. 1, is used to exert an upward force on the thinned wafer 940 to peel the thinned wafer 940 from the backgrind tape 942.

The thinned wafer 940 may be a wafer that has had material removed, such as from a backside of the wafer. Material may be removed from the wafer through different processes, such as etching, grinding, or polishing, to name a few examples. In some embodiments, the thinned wafer 940 has a thickness of 100 microns or less, such as 75 microns or less, such as 50 microns or less, to name a few examples.

In some embodiments, the thinned wafer 940 may be removed from a protective tape instead of the backgrind tape 942. For example, the thinned wafer 940 may be removed from the protective tape prior to singulation.

In some embodiments, the wafer ejector assembly 900 may use any of the die ejectors (e.g., die ejector 120, 320, 420, 520, 620, 720, and 820) previously discussed in FIGS. 1-8 to remove the thinned wafer 940. In some embodiments, the wafer ejector 920 may be the same size as described above or larger in order to engage with a greater surface area of the thinned wafer 940.

In the depicted embodiment, the ejector opening 906 is larger than the thinned wafer 940. In some embodiments, the ejector opening 906 may be substantially the same size and shape as the thinned wafer 940.

In the depicted embodiment, the backgrind tape 942 does not extend beyond the outer wall of the backgrind tape frame 944. In some embodiments, the backgrind tape may extend beyond the outer wall of the backgrind tape frame 944. The plurality of vacuum openings 908 may engage the backgrind tape 942, including the areas beyond the outer wall of the backgrind tape frame 944, to engage a larger surface area compared to only engaging the backgrind tape frame 944.

In some embodiments, the wafer ejector 920 may be used to remove a wafer or thin wafer (e.g., wafers having a thickness of 30 microns or less) from the backgrind tape 942. In some embodiments, the end effector 918 is not used. In some embodiments, the wafer ejector 920 may be used to directly transfer a wafer, thinned wafer, or thin wafer to a host substrate for bonding. The bonding surface of the transferred wafer, which may comprise conductive features, may be bonded to a bonding surface of the host substrate.

In some embodiments, the die ejector assemblies (e.g., any of the die ejector assembly 100, 300, 400, and 800) discussed in relation to FIGS. 1-8 may use a tape frame that is similar to the backgrind tape frame 944 with the dicing tape (e.g., dicing tape 112).

In some embodiments, the die ejection assemblies discussed in relation to FIGS. 1-8 may use a plurality of die ejectors to remove the singulated die 110. Similarly, the wafer ejection assembly 900 discussed in relation to FIG. 9 may use a plurality of wafer ejectors 920 to remove the thinned wafer 940. The processor of the controller 190 may execute the computer-executable instructions to have the actuators 122 move each of the die ejectors or wafer ejectors 920 in the vertical direction and/or lateral direction. The controller 190 may control each die ejector or wafer ejector independently, or simultaneously.

The embodiments discussed above are intended to be illustrative and not limiting. One skilled in the art would appreciate that individual aspects of the apparatus and methods discussed herein may be omitted, modified, combined, and/or rearranged without departing from the scope of the present disclosure. Only the claims that follow are meant to set bounds as to what the present disclosure includes.

What is claimed is:

1. An apparatus for removing singulated dies from a dicing tape, the apparatus comprising:
   a die ejector assembly comprising:
   a vacuum plate having an ejector opening disposed therethrough;
   a die ejector disposed in the ejector opening, wherein at least a portion of the die ejector is movable in a lateral direction relative to an upper surface of the vacuum plate; and
   a flexible barrier disposed over the ejector opening, wherein the die ejector is disposed below the flexible barrier.

2. The apparatus of claim 1, further comprising one or more actuators to position at least a portion of the die ejector above the upper surface of the vacuum plate concurrently with moving the die ejector in the lateral direction.

3. The apparatus of claim 2, wherein the die ejector comprises a cylinder, and the center axis of the cylinder is substantially parallel to the upper surface of the vacuum plate.

4. The apparatus of claim 2, wherein the die ejector comprises a roller having an axis of rotation substantially parallel to the upper surface of the vacuum plate.

5. The apparatus of claim 2, wherein:
   the die ejector comprises a coil spring; and
   the one or more actuators exert a bending moment on the coil spring concurrently with moving the coil spring in the lateral direction.

6. The apparatus of claim 1, wherein the die ejector has a length that is at least twice more than its width, and the length is parallel to the upper surface of the vacuum plate and orthogonal to the lateral direction.

7. The apparatus of claim 6, wherein the die ejector comprises a coil spring.

8. The apparatus of claim 1, further comprising a non-transitory computer-readable storage medium comprising computer-executable instructions that, when executed by a processor, cause the processor to perform operations comprising:
   aligning the ejector opening with a singulated die disposed on the dicing tape;
   engaging the vacuum plate with the dicing tape; and
   exerting, by use of the die ejector, a lateral force on the portion of the dicing tape having the singulated die disposed thereon.

9. A non-transitory computer-readable storage medium comprising computer-executable instructions that, when executed by a processor, cause the processor to perform operations comprising:
   aligning the die ejector assembly according to claim 1 with a portion of the dicing tape having a singulated die disposed thereon;
   engaging the vacuum plate with the dicing tape by exerting a vacuum therebetween; and
   exerting, by use of the die ejector, a lateral force on the portion of the dicing tape having the singulated die disposed thereon.

10. A method for removing a singulated die from a dicing tape, the method comprising:
   aligning the die ejector assembly according to claim 1 with a portion of the dicing tape having the singulated die disposed thereon;
   engaging the vacuum plate with the dicing tape by exerting a vacuum therebetween; and
   exerting, by use of the die ejector, a lateral force on the portion of the dicing tape having the singulated die disposed thereon.

11. The method of claim 10, wherein exerting the lateral force on the portion of the dicing tape comprises moving the die ejector from a position proximate to a first edge of the singulated die to a position proximate to an opposite second edge of the singulated die.

12. The method of claim 10, further comprising:
   concurrently with exerting the lateral force on the portion of the dicing tape, engaging the singulated die using an end effector disposed thereabove.

13. An apparatus for removing singulated dies from a dicing tape, the apparatus comprising:
   a die ejector assembly comprising:
   a vacuum plate having an ejector opening disposed therethrough; and a die ejector disposed in the ejector opening, wherein:

at least a portion of the die ejector is movable in a lateral direction relative to an upper surface of the vacuum plate;

the die ejector comprises a resilient member; and an end of the resilient member is coupled to the vacuum plate.

14. The apparatus of claim 13, wherein the resilient member is compressible in the lateral direction.

15. The apparatus of claim 14, wherein the die ejector comprises a coil spring.

16. The apparatus of claim 14, wherein the die ejector comprises a leaf spring.

17. The apparatus of claim 13, wherein:

the resilient member includes a first resilient member and a second resilient member;

the first resilient member is coupled to the vacuum plate;

the second resilient member is coupled to the first resilient member; and the first resilient member has a first spring constant, and the second resilient member has a second spring constant that is less than the first spring constant.

18. An apparatus for removing singulated dies from a dicing tape, the apparatus comprising:

a die ejector assembly comprising:

a vacuum plate having an ejector opening disposed therethrough;

a die ejector disposed in the ejector opening, wherein:

at least a portion of the die ejector is movable in a lateral direction relative to an upper surface of the vacuum plate; and the die ejector comprises a bladder.

\* \* \* \* \*